(12) United States Patent
Chen et al.

(10) Patent No.: US 6,281,082 B1
(45) Date of Patent: Aug. 28, 2001

(54) METHOD TO FORM MOS TRANSISTORS WITH A COMMON SHALLOW TRENCH ISOLATION AND INTERLEVEL DIELECTRIC GAP FILL

(75) Inventors: Feng Chen; Kok Hin Teo; Kok Hiang Tang; Alex See, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/524,526

(22) Filed: Mar. 13, 2000

(51) Int. Cl.$^7$ .................................................. H01L 21/76
(52) U.S. Cl. ............................ 438/296; 438/430; 438/435
(58) Field of Search .................................... 438/296, 424, 438/430, 435

(56) References Cited

U.S. PATENT DOCUMENTS

| | | | |
|---|---|---|---|
| 4,994,409 | * 2/1991 | Yoon et al. | 438/435 |
| 5,346,584 | 9/1994 | Nasr et al. | 156/636 |
| 5,786,255 | 7/1998 | Yeh et al. | 438/299 |
| 5,856,225 | 1/1999 | Lee et al. | 438/291 |
| 5,915,183 | 6/1999 | Gambino et al. | 438/300 |
| 6,177,699 | * 1/2001 | Perng et al. | 257/303 |

FOREIGN PATENT DOCUMENTS

| | | | |
|---|---|---|---|
| 02177355-A | * 7/1990 | (JP) | H01L/21/302 |
| 9200708-B | * 1/1992 | (KR) | H01L/21/302 |

* cited by examiner

*Primary Examiner*—Charles Bowers
*Assistant Examiner*—David S Blum
(74) *Attorney, Agent, or Firm*—George O. Saile; Rosemary L. S. Pike

(57) ABSTRACT

A new method of forming MOS transistors in the manufacture of an integrated circuit device has been achieved. A semiconductor substrate is provided. A pad oxide layer is deposited. A silicon nitride layer is deposited. Trenches are patterned for planned shallow trench isolations. The sidewalls of the trenches are oxidized. A photoresist layer is deposited overlying the silicon nitride layer and filling the trenches. The photoresist layer is etched down to below the top surface of the silicon nitride layer. The silicon nitride layer is patterned to form dummy gate electrodes. Sidewall spacers are formed on the dummy gate electrodes. The photoresist layer is removed. A dielectric layer is deposited overlying the dummy gate electrodes and the trenches. The dielectric layer is polished down to the top surface of the dummy gate electrodes to thereby complete the STI and the ILD. The dummy gate electrodes are etched away. A gate oxide layer is formed. A gate electrode layer is deposited overlying the dielectric layer and filling the openings for the planned transistor gates. The gate electrode layer is polished down to form the transistor gates, and the integrated circuit is completed.

20 Claims, 8 Drawing Sheets

METHOD TO FORM MOS TRANSISTORS WITH A COMMON SHALLOW TRENCH ISOLATION AND INTERLEVEL DIELECTRIC GAP FILL

BACKGROUND OF THE INVENTION (1) Field of the Invention

The invention relates to a method of fabricating semiconductor structures, and more particularly, to a method of forming MOS transistors with a common shallow trench isolation and interlevel dielectric gap fill in the manufacture of integrated circuit devices.

(2) Description of the Prior Art

Shallow trench isolation (STI) has replaced local oxidation of silicon (LOCOS) for formation of active area isolations in integrated circuits with feature sizes of 0.25 microns and below. STI is superior to LOCOS for these applications because of smaller area requirements and better planarity.

Referring now to FIG. 1, a cross section of a prior art integrated circuit device is shown. This cross section illustrates some of the potential problems in the prior art. A semiconductor substrate 10 is provided. Two STI structures 14 have been formed in the semiconductor substrate 10. The STI structures 14 have been formed using conventional processes. In the leftmost example, a trench is etched into the semiconductor substrate 10. A trench filling oxide layer 14 is deposited overlying the semiconductor substrate 10 and filling the trench. The trench filling oxide layer 14 is polished down to the top surface of the semiconductor substrate 10 to complete the STI. Note that some overetching 18 and rounding of the corners occurs. These topological features can cause high leakage currents in the MOS devices formed adjacent to the STI.

In the rightmost example, a different process approach is taken. Typically, a silicon nitride layer, not shown, is deposited overlying the semiconductor substrate 10. The trench is etched through the silicon nitride layer and the semiconductor substrate 10. The trench filling oxide layer 14 is deposited overlying the semiconductor substrate 10 and filling the trench. The trench filling oxide layer 14 is polished down to the silicon nitride layer 14. The silicon nitride layer is then removed to complete the STI. In this example, the topology problems of the leftmost example are prevented. However, the STI now has an elevation that can cause other problems in the formation of surface features near the STI.

Referring now to FIG. 2, the use of the STI structures with a MOS transistor is illustrated. The STI structures 34 are typically formed first into the semiconductor substrate 30. The MOS gate structure, comprising a gate oxide 38 and a polysilicon gate electrode 42, is then formed overlying the semiconductor substrate 30. The lightly doped drains 50 are implanted self-aligned to the gate electrode 42 and the STI structures 34. The sidewall spacers 46 are then formed. The source or drain regions 54 are then implanted self-aligned to the sidewall spacers 46 and the STI structures 34. Finally, an interlevel dielectric layer (ILD) 58 is deposited overlying the completed MOS transistor and the STI structures 34. The interlevel dielectric layer 58 is typically polished down to achieve a good planarization. Observe that typically both the STI trench filling oxide layer 34 and the interlevel dielectric layer 58 are composed of silicon dioxide. In addition, both layers are polished down in separate chemical mechanical polishing (CMP) operations.

Several prior art approaches disclose methods to form transistors and shallow trench isolations in the manufacture of an integrated circuit device. U.S. Pat. No. 5,856,225 to Lee et al discloses a method to form a MOSFET with a self-aligning channel. A temporary polysilicon gate is used in the formation of the transistor using a process that is conventional excepting delaying the threshold voltage and anti-punchthrough implants until after the MOSFET is formed. The temporary polysilicon gate is removed, the implants are performed, and then a new polysilicon layer is deposited and polished down to form the permanent gate. U.S. Pat. No. 5,786,255 to Yeh et al teaches a method to form a MOSFET with STI structures. A thick silicon nitride layer is deposited overlying the semiconductor substrate. The silicon nitride layer and the semiconductor substrate are etched to form openings for the STI. The STI is filled and planarized. Openings are etched through the silicon nitride layer where transistors are planned. Gate oxide is formed in the transistor openings. Silicide is formed in the transistor openings. The silicon nitride is removed. Sidewalls are formed on both the transistor gates and on the STI. Drains and sources are implanted. An interlevel dielectric layer is deposited and planarized. U.S. Pat. No. 5,915,183 to Gambino et al discloses a method to form raised drains and sources. A thick silicon nitride layer and the semiconductor substrate are etched to form trenches for STI. The STI are filled and planarized. Openings are etched through the silicon nitride layer for planned transistor gates. Polysilicon is deposited and planarized. The silicon nitride layer is etched to form sidewall spacers on the polysilicon gate and the STI. A second polysilicon layer is deposited to fill spaces between the STI and the polysilicon gates. The second polysilicon layer is polished down. The second polysilicon layer is recessed. The drain and source regions are formed in the second polysilicon layer. U.S. Pat. No. 5,346,584 to Nasr et al teaches a process to form STI. Trenches are etched through silicon nitride, pad oxide, and the substrate. An oxide fill layer is deposited. A polysilicon layer is deposited overlying the oxide fill layer. The polysilicon layer is patterned and oxidized to improve the oxide layer topology. The surface is then planarized.

SUMMARY OF THE INVENTION

A principal object of the present invention is to provide an effective and very manufacturable method of forming MOS transistors in the manufacture of integrated circuits.

A further object of the present invention is to provide a method to form transistors with shallow trench isolations and an interlevel dielectric layer.

A still further object of the present invention is to form the shallow trench isolations and the interlevel dielectric layer using a common dielectric layer.

Another further object of the present invention is to improve the characteristics of the shallow trench isolations.

In accordance with the objects of this invention, a new method of forming MOS transistors in the manufacture of an integrated circuit device has been achieved. A semiconductor substrate is provided. A pad oxide layer is deposited overlying the semiconductor substrate. A silicon nitride layer is deposited overlying the pad oxide layer. The silicon nitride layer, pad oxide layer, and the semiconductor substrate are patterned to form trenches for planned shallow trench isolations. The sidewalls of the trenches are oxidized. A photoresist layer is deposited overlying the silicon nitride layer and filling the trenches. The photoresist layer is etched down to below the top surface of the silicon nitride layer. Ions are implanted into the semiconductor substrate to form transistor wells. The silicon nitride layer is patterned to form dummy gate electrodes where dummy gate electrodes are planned. The presence of the photoresist masks the trenches from the patterning step. Ions are implanted into the semiconductor substrate to form lightly doped drain junctions. Sidewall spacers are formed on the dummy gate electrodes. Ions are implanted into the semiconductor substrate to form drain and source junctions. The photoresist layer is removed. Thereafter, a dielectric layer is deposited overlying the dummy gate electrodes and the trenches. The dielectric layer is polished down to the top surface of the dummy gate electrodes to thereby complete the shallow trench isolation and to form the interlevel dielectric layer. The silicon nitride layer is etched away leaving openings for the planned transistor gates. The pad oxide layer is etched away. A gate oxide layer is formed in the openings for the planned transistor gates. A gate electrode layer is deposited overlying the dielectric layer and filling the openings for the planned transistor gates. The gate electrode layer is polished down to form the transistor gates, and the integrated circuit is completed.

BRIEF DESCRIPTION OF THE DRAWINGS

In the accompanying drawings forming a material part of this description, there is shown.

DESCRIPTION OF THE PREFERRED EMBODIMENTS

The embodiment discloses the application of the present invention to the formation of MOS transistors with shallow trench isolations and interlevel dielectric layers in the manufacture of an integrated circuit device. It should be clear to those experienced in the art that the present invention can be applied and extended without deviating from the scope of the present invention.

Figure 1:
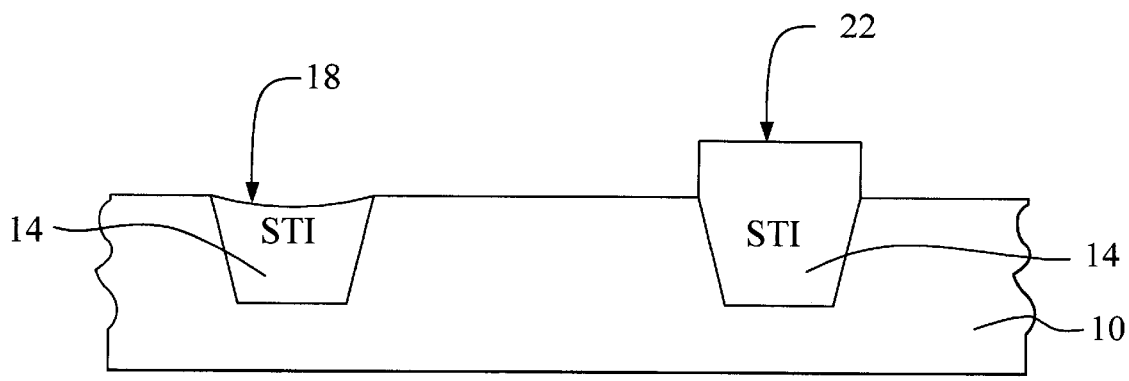
FIGS. 1 and 2 schematically illustrate in cross-section partially completed prior art integrated circuit devices.
Figure 2:
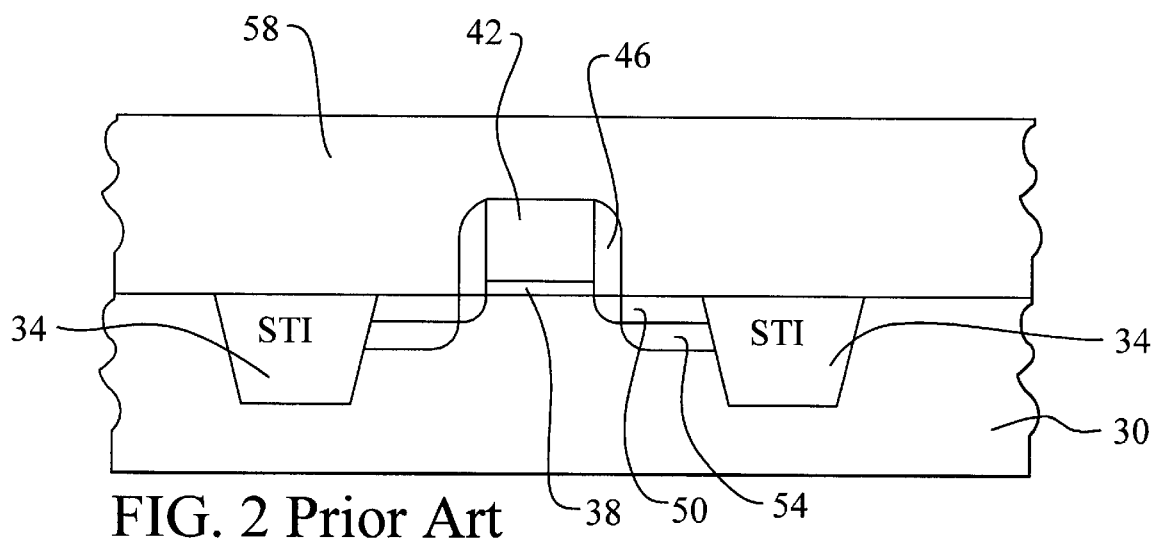
Figure 3:
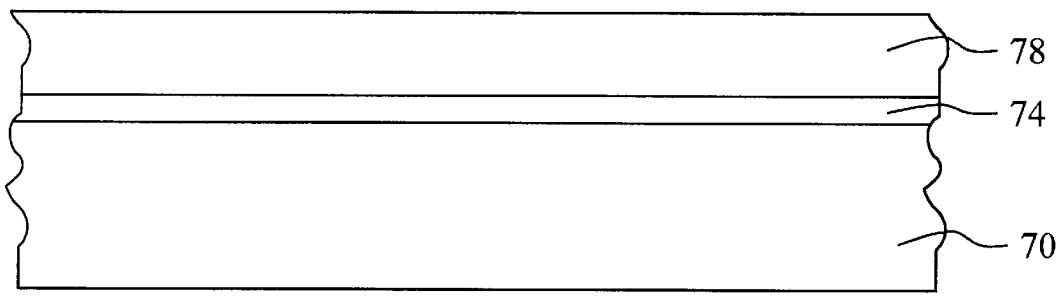
FIGS. 3 through 17 schematically illustrate in cross-section the preferred embodiment of the present invention.

Referring now particularly to FIG. 3, there is shown a cross section of a partially completed integrated circuit device of the preferred embodiment. A semiconductor substrate 70, typically consisting of monocrystalline silicon, is provided. A pad oxide layer 74 is deposited overlying the semiconductor substrate 70 as shown. The pad oxide layer 74 relieves surface stress and provides better adhesion for the subsequently deposited silicon nitride layer. The pad oxide layer is deposited by a conventional chemical vapor deposition (CVD) process to a thickness of between about 50 Angstroms and 200 Angstroms. A silicon nitride layer 78 is deposited overlying the pad oxide layer 74. The silicon nitride layer 78 will be used to create a dummy gate electrode and as a polishing stop. The silicon nitride layer 78 is deposited using a conventional CVD process to a thickness of between about 1,000 Angstroms and 2,500 Angstroms. The combined thickness of the silicon nitride layer 78 and the pad oxide layer 74 is important because it determines the thickness of the final transistor gate electrode.

Figure 4:
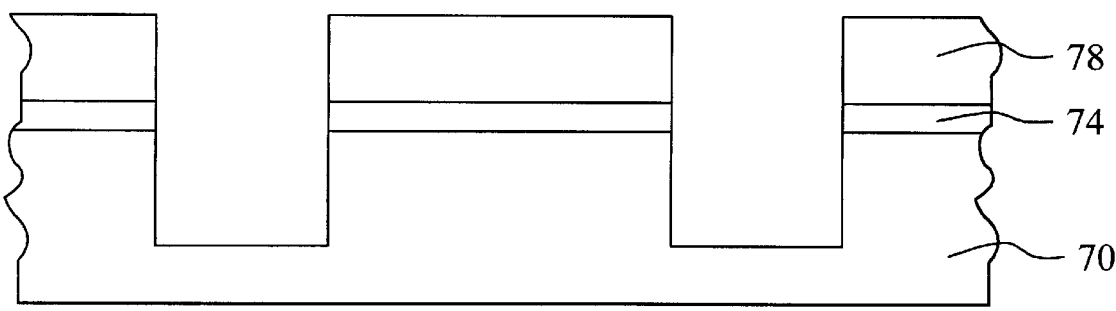

Referring now to FIG. 4, the silicon nitride layer 78, the pad oxide layer 74, and the semiconductor substrate 70 are patterned to form trenches for planned shallow trench isolations. The patterning is conventionally performed using a photolithographic sequence of coating with photoresist, exposing through a mask, developing, and etching. The trenches for the planned shallow trench isolations are etched to a depth of between about 3,000 Angstroms and 6,000 Angstroms.

Figure 5:
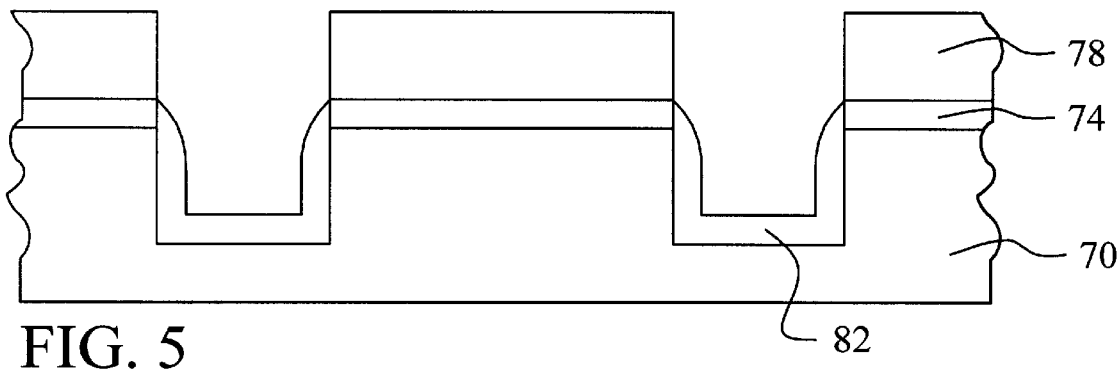

Referring now to FIG. 5, the trenches are oxidized to form an oxide layer 82. The presence of the oxide layer 82, especially on the sidewalls, reduces the parasitic junction leakage for devices formed adjacent to the STI. This step is optional to the present invention process. The oxidation step is performed by a thermal oxidation. The oxide layer 82 is grown to a thickness of between about 100 Angstroms and 400 Angstroms.

Figure 6:
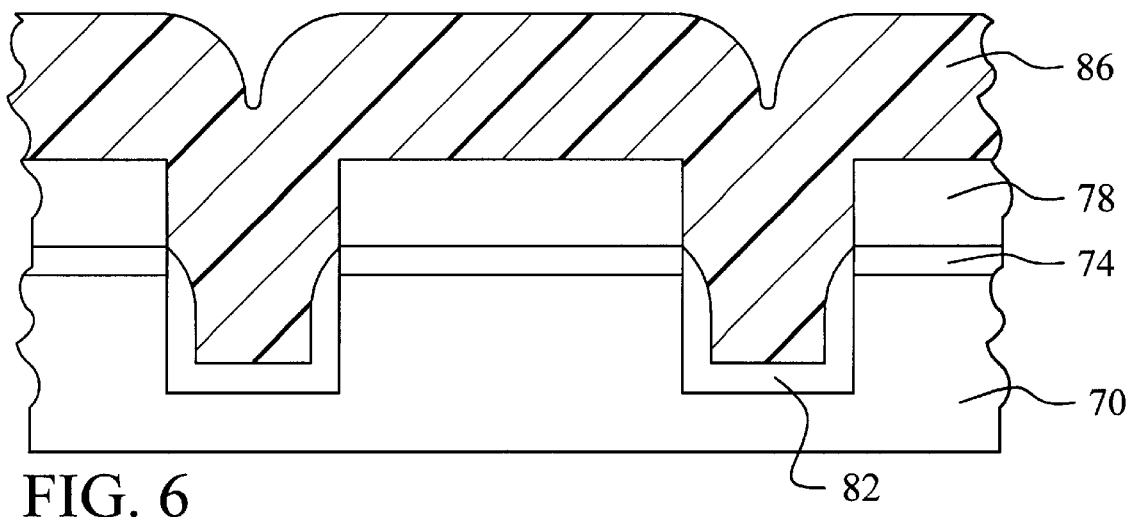

Referring now to FIG. 6, an important feature of the present invention is illustrated. A photoresist layer 86 is deposited overlying the silicon nitride layer 78 and filling the trenches. The photoresist layer 86 will protect the STI trench during the processing steps used to define the dummy transistor gate and to create the source and drain junctions. The photoresist layer 86 is deposited using a spin-on process as is conventional for photoresist. The photoresist layer 86 is deposited to a thickness of between about 4,000 Angstroms and 8,000 Angstroms.

Figure 7:
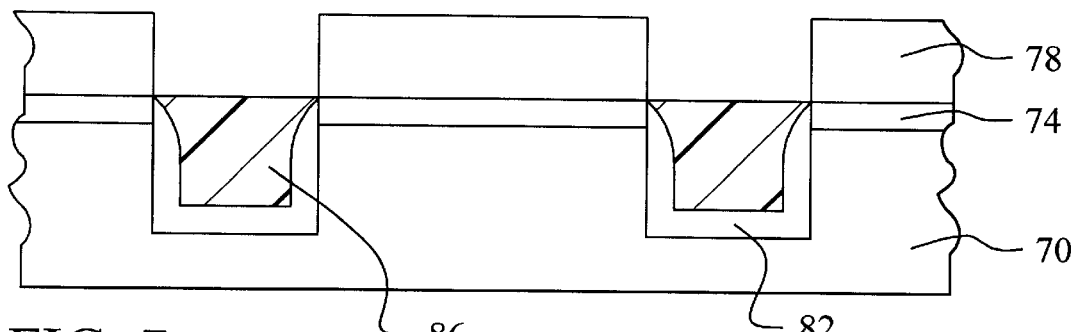

Referring now to FIG. 7, another important feature is shown. The photoresist layer 86 is etched down to below the top surface of the silicon nitride layer 78. This etching down step exposes the silicon nitride layer 78 for subsequent processing while maintaining a protective covering of photoresist over the STI trenches. The etching down is performed using a controlled process comprising: $CH_3$ for etching, $CF_4$ for polymer formation, and Ar for bombardment.

Figure 8:
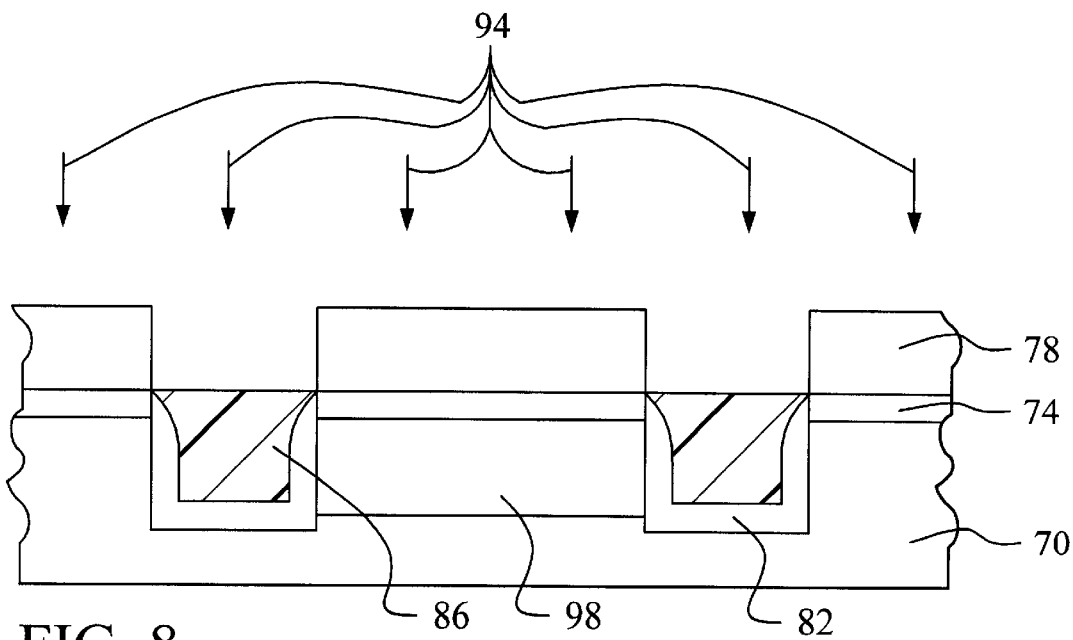

Referring now to FIG. 8, ions are implanted 94 into the semiconductor substrate to form transistor wells 98. Depending upon the transistor type, specific ions are implanted to form either p-type or n-type wells 98 in the transistor region. The presence of the photoresist layer 86 overlying the STI trenches protects the trenches from dopant contamination. The wells 98 so formed have a junction depth of between about 0.5 microns and 1.5 microns and a dopant concentration of between about $1 \times 10^{15}$ atoms/cm$^3$ and $1 \times 10^{16}$ atoms/cm$^3$.

Figure 9:
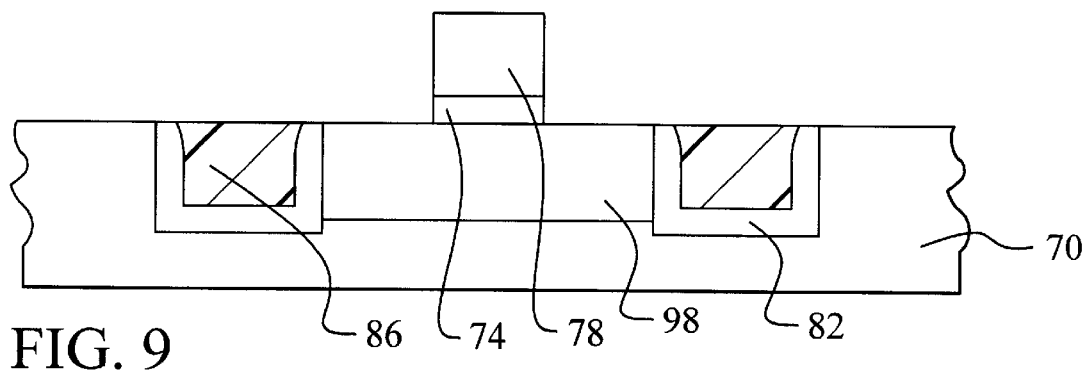

Referring now to FIG. 9, the silicon nitride layer 78 and the pad oxide layer 74 are patterned to form dummy gate electrodes where the transistor gate electrodes are planned. The patterning is performed using a conventional photolithographic sequence of depositing photoresist (not shown), exposing through a mask, developing, and etching.

Figure 10:
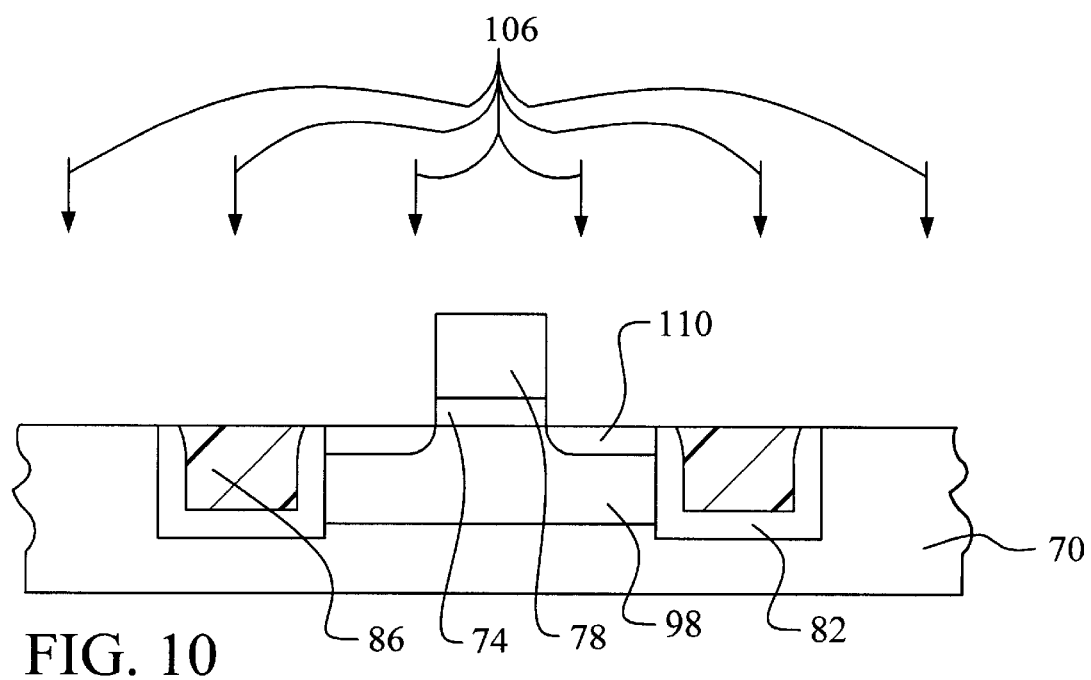

Referring now to FIG. 10, ions are implanted into the semiconductor substrate 70 to form lightly doped drain regions 110 for the planned transistors. The dose and energy of the implant is such that implantation is self-aligned to the dummy gate electrode 78 and the STI overlaid by the photoresist layer 86. The ionic species is selected to form either p-type or n-type junctions, depending upon the transistor type. The lightly doped drain regions have a junction depth of between about 0.1 microns and 0.2 microns and a dopant concentration of between about $1 \times 10^{17}$ atoms/cm$^3$ and $1 \times 10^{18}$ atoms/cm$^3$.

Figure 11:
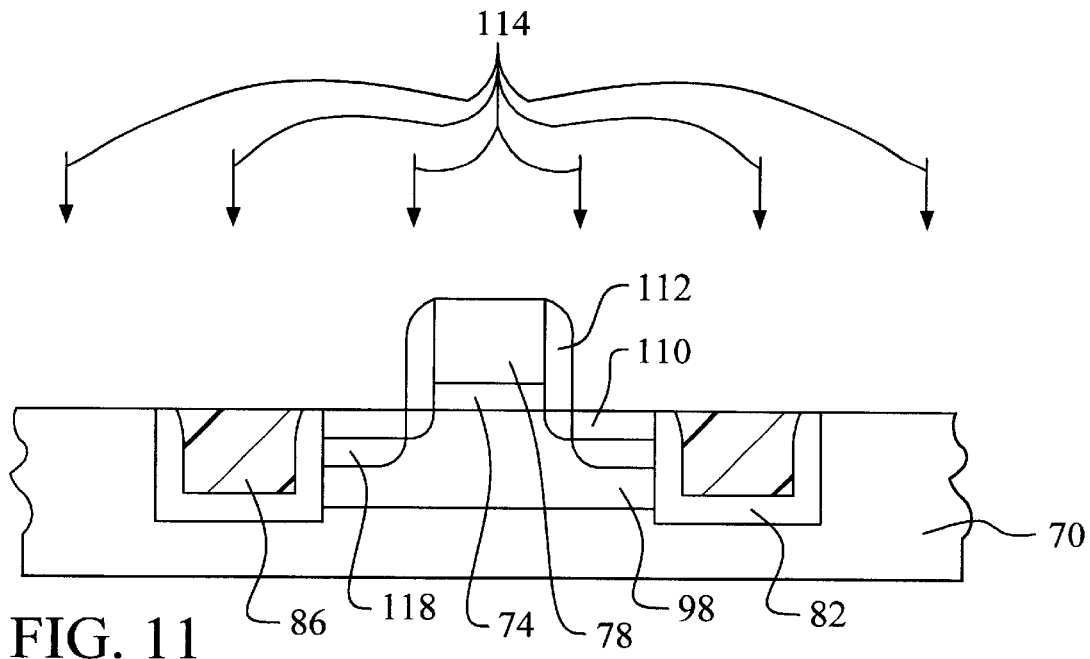

Referring now to FIG. 11, sidewall spacers 112 are formed on the dummy gate electrode. The sidewall spacers 112 comprise silicon dioxide that is deposited using a conventional high density plasma "sputter-deposit" process. Ions are implanted 114 into the semiconductor substrate 70 to form source and drain junctions 118 for the transistor. The ionic species is selected to create either p-type or n-type junctions depending on the transistor type. The junctions 118 are self-aligned to the sidewall spacers 112 and the STI regions.

Figure 12:
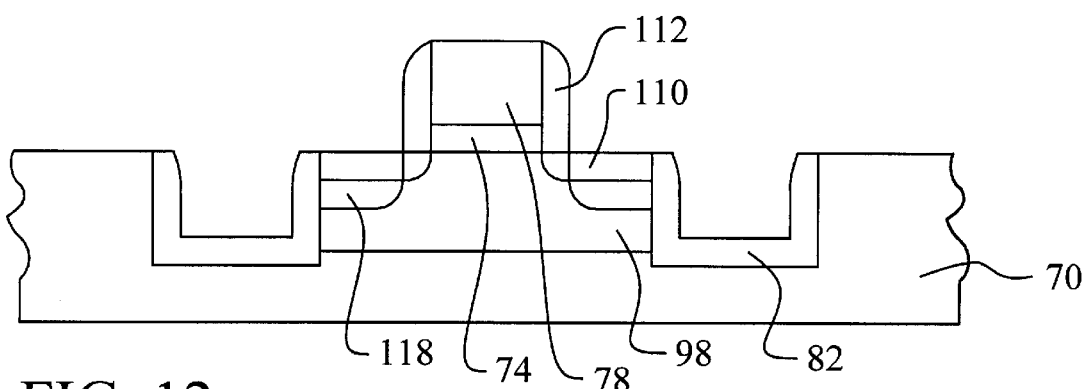

Referring now to FIG. 12, the photoresist layer 86 is removed. The photoresist layer 86 is preferably removed by a conventional oxygen ashing process.

Figure 13:
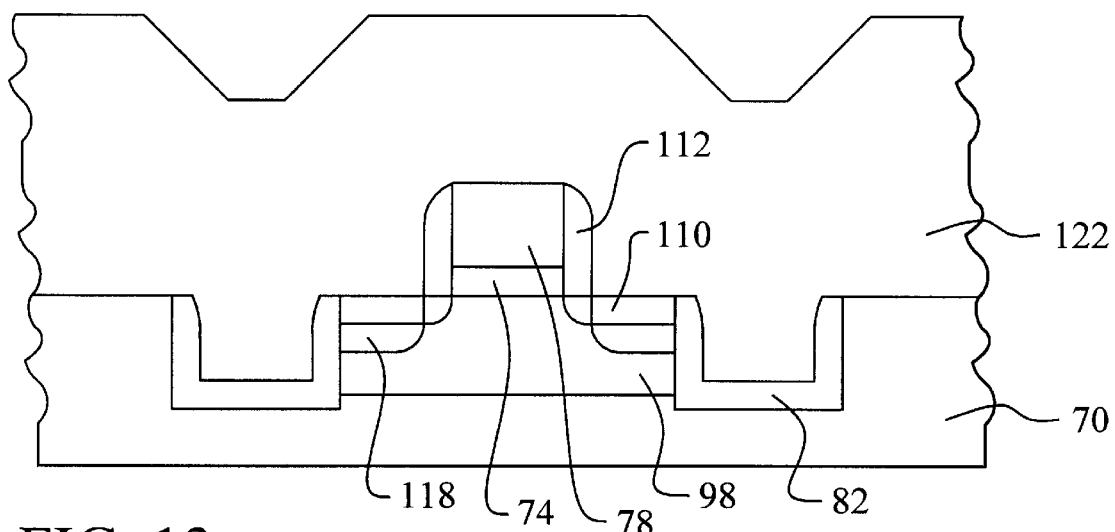

Referring now to FIG. 13, another important feature of the present invention is illustrated. A dielectric layer 122 is deposited overlying the dummy gate electrode 78, the transistor structure, the semiconductor substrate 70, and filling the STI trenches. The dielectric layer 122 comprises a silicon dioxide material that is preferably deposited using a high density plasma (HDP) process. The use of an HDP process insures the formation of a high quality oxide and complete filling of any gaps and trenches. The dielectric layer is deposited to a thickness of between about 8,000 Angstroms and 15,000 Angstroms.

Importantly, the dielectric layer 122 serves two purposes. First deposition of the dielectric layer 122 completes the formation of the STI structures. Second, the dielectric layer 122 will serve additionally as the interlevel dielectric layer (ILD) to surround and isolate the completed transistor.

Figure 14:
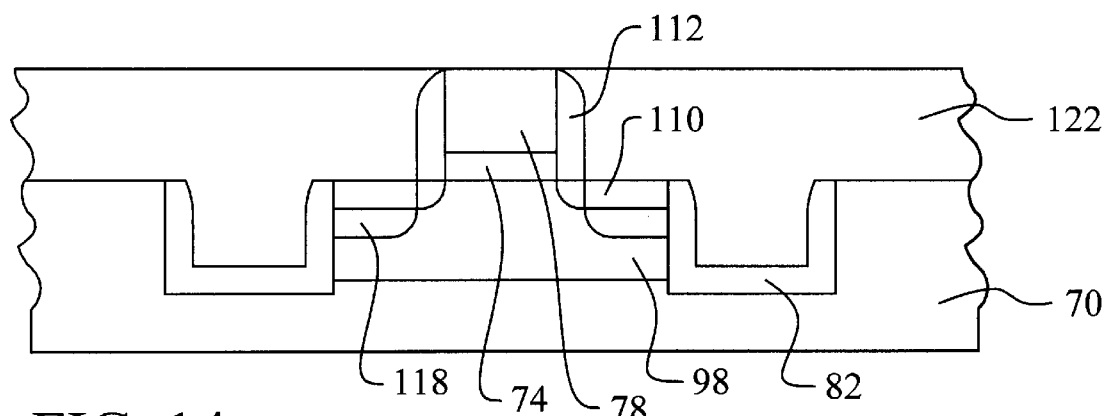

Referring now to FIG. 14, the dielectric layer 122 is polished down to the top surface of the silicon nitride layer 78. This step planarizes the dielectric layer 122 to create an optimum ILD for the device. The silicon nitride layer 78 acts as a polishing stop for the chemical mechanical polishing process used in this step. Note especially, that only one CMP polish is required to define and planarize both the STI and the ILD.

Figure 15:
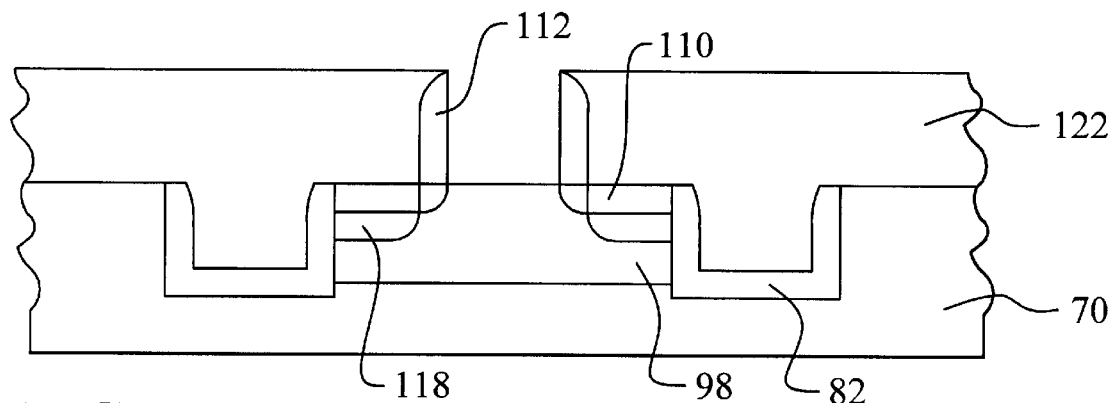

Referring now to FIG. 15, the silicon nitride layer 78 and the pad oxide layer 74 are etched away. This step creates openings where the permanent gate electrodes will be formed. The etching away step is performed using a conventional etching process comprising: $CH_3$ for etching, $CF_4$ for polymer formation, and Ar for bombardment.

Figure 16:
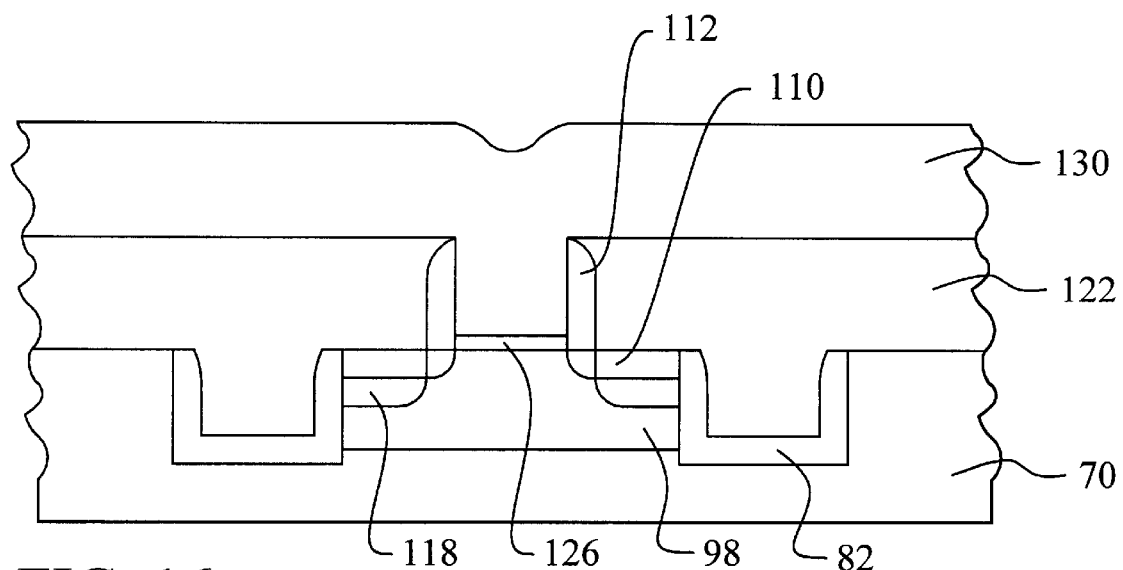

Referring now to FIG. 16, a gate oxide layer 126 is deposited overlying the semiconductor substrate 70 in the openings created for the gate electrodes. The gate oxide layer 126 is deposited via a conventional CVD process. The gate oxide layer 126 is deposited to a thickness of between about 50 Angstroms and 200 Angstroms. A gate electrode layer 130 is deposited overlying the gate oxide layer 126, the dielectric layer 122, and filling the openings for the gate electrodes. The gate electrode layer 130 comprises a conductive such as polysilicon or metal. The gate electrode layer 130 is deposited to a thickness of between about 2,000 Angstroms and 5,000 Angstroms.

Figure 17:
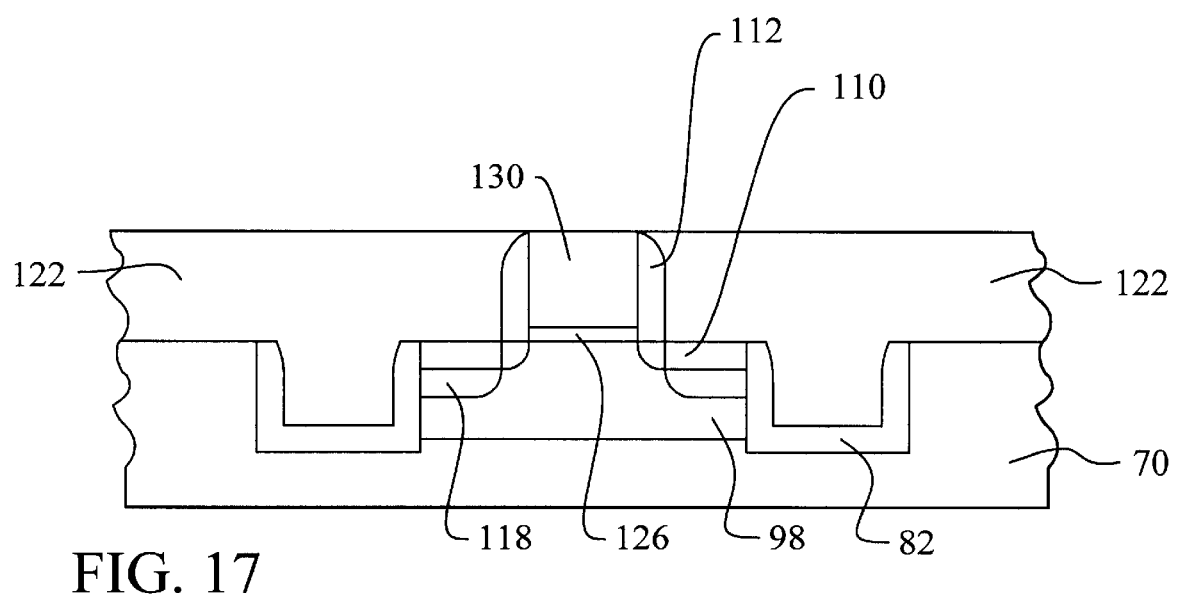

Referring now to FIG. 17, a final important part of the present invention is illustrated. The gate electrode layer 130 is polished down to the top surface of the dielectric layer 122 to complete the formation of the transistor gate electrode and the transistor in the manufacture of the integrated circuit device. The gate electrode layer 130 is polished down using a chemical mechanical polishing (CMP) process.

The completed device has several advantages over the prior art structure. First, the dielectric layer 122 is seamless across the STI and the ILD structures. This eliminates potential current leakage paths. Second, there is no STI notch to present step coverage difficulties. Third, the CMP process used to planarize the dielectric layer 122 never comes close to the semiconductor substrate 70. Therefore, no dishing or overpolishing can occur.

As shown in the preferred embodiments, the present invention provides a very manufacturable process for forming MOS transistors with shallow trench isolations and interlevel dielectric layers in an integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method to form transistor gates and shallow trench isolations in the manufacture of an integrated circuit device comprising:

providing a semiconductor substrate;

depositing a pad oxide layer overlying said semiconductor substrate;

depositing a silicon nitride layer overlying said pad oxide layer;

patterning said silicon nitride layer, said pad oxide layer, and said semiconductor substrate to form trenches for planned shallow trench isolations;

depositing a photoresist layer overlying said silicon nitride layer and filling said trenches;

etching down said photoresist layer to below the top surface of said silicon nitride layer the trench remaining filled;

patterning said silicon nitride layer and said pad oxide layer to form dummy gates where said transistor gates are planned and wherein the presence of said photoresist layer protects said trenches from patterning;

removing said photoresist layer;

thereafter depositing a dielectric layer overlying said dummy gates and said trenches;

polishing down said dielectric layer to the top surface of said dummy gates to thereby form said shallow trench isolations and to form a planarized interlevel dielectric layer;

etching away said dummy gates to form openings for said planned transistor gate electrodes;

depositing a gate electrode layer overlying said dielectric layer and filling said openings for said planned transistor gate electrode; and polishing down said gate electrode layer to form said transistor gates and to complete said integrated circuit device.

2. The method according to claim 1 wherein said pad oxide layer is deposited to a thickness of between about 50 Angstroms and 200 Angstroms.

3. The method according to claim 1 wherein said silicon nitride layer is deposited to a thickness of between about 1,000 Angstroms and 2,500 Angstroms.

4. The method according to claim 1 wherein said photoresist layer is deposited to a thickness of between about 4,000 Angstroms and 8,000 Angstroms.

5. The method according to claim 1 wherein said dielectric layer comprises a silicon dioxide deposited by a high density plasma process.

6. The method according to claim 1 wherein said dielectric layer is deposited to a thickness of between about 8,000 Angstroms and 15,000 Angstroms.

7. The method according to claim 1 wherein said gate electrode layer comprises a conductive material of the group containing: polysilicon, W, $WSi_x$, WSiN, $WN_x$, and TiN.

8. The method according to claim 1 further comprising oxidizing said trenches to form an oxide layer on the inside surfaces of said trenches wherein said oxidizing is performed after said step of patterning said silicon nitride layer, said pad oxide layer, and said semiconductor substrate to form said trenches and wherein said oxidizing is performed before said step of depositing said photoresist layer.

9. The method according to claim 1 further comprising forming sidewall spacers on said dummy gate electrodes wherein said forming is after said step of patterning said silicon nitride layer and said pad oxide layer to form said dummy gate electrodes and wherein said forming is before said step of removing said photoresist layer.

10. A method to form MOS transistors with shallow trench isolations in the manufacture of an integrated circuit device comprising:

providing a semiconductor substrate;

depositing a pad oxide layer overlying said semiconductor substrate;

depositing a silicon nitride layer overlying said pad oxide layer;

patterning said silicon nitride layer, said pad oxide layer, and said semiconductor substrate to form trenches for planned shallow trench isolations;

depositing a photoresist layer overlying said silicon nitride layer and filling said trenches;

implanting ions into said semiconductor substrate to form transistor well junctions;

etching down said photoresist layer to below the top surface of said silicon nitride layer the trench remaining filled;

patterning said silicon nitride layer and said pad oxide layer to form dummy gates where said transistor gates are planned and wherein the presence of said photoresist layer protects said trenches from patterning;

implanting ions into said semiconductor substrate to form lightly doped drain junctions;

forming sidewall spacers on said dummy gate electrodes;

implanting ions into said semiconductor substrate to form source and drain junctions;

removing said photoresist layer;

thereafter depositing a dielectric layer overlying said dummy gates and said trenches;

polishing down said dielectric layer to the top surface of said dummy gates to thereby form said shallow trench isolations and to form a planarized interlevel dielectric layer;

etching away said dummy gates to form openings for said planned transistor gate electrodes;

depositing a gate electrode layer overlying said dielectric layer and filling said openings for said planned transistor gate electrode; and polishing down said gate electrode layer to form said transistor gates and to form said transistors and to complete said integrated circuit device.

11. The method according to claim 10 wherein said pad oxide layer is deposited to a thickness of between about 50 Angstroms and 200 Angstroms.

12. The method according to claim 10 wherein said silicon nitride layer is deposited to a thickness of between about 1,000 Angstroms and 2,500 Angstroms.

13. The method according to claim 10 wherein said photoresist layer is deposited to a thickness of between about 4,000 Angstroms and 8,000 Angstroms.

14. The method according to claim 10 wherein said dielectric layer comprises a silicon dioxide deposited by a high density plasma process.

15. The method according to claim 10 wherein said dielectric layer is deposited to a thickness of between about 8,000 Angstroms and 15,000 Angstroms.

16. The method according to claim 10 wherein said gate electrode layer comprises a conductive material of the group containing: polysilicon, W, $WSi_x$, WSiN, $WN_x$, and TiN.

17. The method according to claim 10 further comprising oxidizing said trenches to form an oxide layer on the inside surfaces of said trenches wherein said oxidizing is performed after said step of patterning said silicon nitride layer, said pad oxide layer, and said semiconductor substrate to form said trenches and wherein said oxidizing is performed before said step of depositing said photoresist layer.

18. A method to form MOS transistors with shallow trench isolations in the manufacture of an integrated circuit device comprising:

providing a semiconductor substrate;

depositing a pad oxide layer overlying said semiconductor substrate;

depositing a silicon nitride layer overlying said pad oxide layer;

patterning said silicon nitride layer, said pad oxide layer, and said semiconductor substrate to form trenches for planned shallow trench isolations;

oxidizing said trenches to form an oxide layer on the inside surfaces of said trenches;

depositing a photoresist layer overlying said silicon nitride layer and filling said trenches;

implanting ions into said semiconductor substrate to form transistor well junctions;

etching down said photoresist layer to below the top surface of said silicon nitride layer the trench remaining filled;

patterning said silicon nitride layer and said pad oxide layer to form dummy gates where said transistor gates are planned and wherein the presence of said photoresist layer protects said trenches from patterning;

implanting ions into said semiconductor substrate to form lightly doped drain junctions;

forming sidewall spacers on said dummy gate electrodes;

implanting ions into said semiconductor substrate to form source and drain junctions;

removing said photoresist layer;

thereafter depositing a dielectric layer overlying said dummy gates and said trenches wherein said dielectric layer comprises a silicon dioxide deposited by a high density plasma process;

polishing down said dielectric layer to the top surface of said dummy gates to thereby form said shallow trench isolations and to form a planarized interlevel dielectric layer;

etching away said dummy gates to form openings for said planned transistor gate electrodes;

depositing a gate electrode layer overlying said dielectric layer and filling said openings for said planned transistor gate electrode; and polishing down said gate electrode layer to form said transistor gates and to form said transistors and to complete said integrated circuit device.

19. The method according to claim 18 wherein said photoresist layer is deposited to a thickness of between about 4,000 Angstroms and 8,000 Angstroms.

20. The method according to claim 18 wherein said gate electrode layer comprises a conductive material of the group containing: polysilicon, W, $WSi_x$, WSiN, $WN_x$, and TiN.

* * * * *